(12) United States Patent
Huang et al.

(10) Patent No.: US 10,627,855 B2
(45) Date of Patent: Apr. 21, 2020

(54) DISPLAY DEVICE WITH THIN THICKNESS AND SLIM BEZEL AND OUTER BEZEL FRAME THEREOF

(71) Applicant: Wistron Corporation, New Taipei (TW)

(72) Inventors: Guo-Wei Huang, New Taipei (TW); Wei-Chia Huang, New Taipei (TW); Chih-Chou Chou, New Taipei (TW); Yao-Chen Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/224,826

(22) Filed: Dec. 19, 2018

(65) Prior Publication Data

US 2020/0081482 A1    Mar. 12, 2020

(30) Foreign Application Priority Data

Sep. 6, 2018    (CN) .......................... 2018 1 1036411

(51) Int. Cl.
*G06F 1/16*    (2006.01)
*H05K 5/03*    (2006.01)
(Continued)

(52) U.S. Cl.
CPC ........ *G06F 1/1601* (2013.01); *F21V 33/0052* (2013.01); *G02F 1/133308* (2013.01);
(Continued)

(58) Field of Classification Search
CPC ... G06F 1/1601; G06F 1/1637; H05K 5/0217; H05K 5/0017; H05K 5/03; G02F 1/133308; G02F 2001/133325; G02F 2001/133314; G02F 1/133608; G02B 6/0088; F21V 33/0052

See application file for complete search history.

(56) References Cited

U.S. PATENT DOCUMENTS 8,836,886 B2 *    9/2014    Yu ..................... G02F 1/133308
                                                           349/158
9,383,599 B2 *    7/2016    Yuan ................. G02F 1/133308
(Continued)

FOREIGN PATENT DOCUMENTS

TW    201350970 A    12/2013
TW    201734983 A    10/2017

*Primary Examiner* — Peggy A Neils
(74) *Attorney, Agent, or Firm* — Winston Hsu (57) ABSTRACT

A display device includes a backlight module, a rear casing, an outer bezel frame, and a panel module. The backlight module includes a back plate and a light emitting assembly disposed on the back plate for emitting light. The rear casing covers the backlight module. The outer bezel frame includes a bezel body, a first fixing portion and a second fixing portion. The first fixing portion and the second fixing portion are disposed on a rear side of the bezel body and spaced apart from each other in a lateral direction. The second fixing portion is located at a side of the first fixing portion away from the backlight module. The first fixing portion and the second fixing portion are respectively fixed to the back plate and the rear casing in the lateral direction. The panel module is fixed on a front side of the bezel body for displaying images.

26 Claims, 10 Drawing Sheets

(51) Int. Cl.
*F21V 33/00* (2006.01)
*H05K 5/02* (2006.01)
*G02F 1/1333* (2006.01)
*H05K 5/00* (2006.01)

(52) U.S. Cl.
CPC ......... *H05K 5/0017* (2013.01); *H05K 5/0217* (2013.01); *H05K 5/03* (2013.01); *G02F 2001/133314* (2013.01); *G02F 2001/133325* (2013.01)

(56) References Cited

U.S. PATENT DOCUMENTS

| | | | |
|---|---|---|---|
| 9,612,466 B2 * | 4/2017 | Arita | G02F 1/133308 |
| 10,180,534 B2 * | 1/2019 | Oh | G06F 1/1637 |
| 10,194,542 B2 * | 1/2019 | Lee | H05K 5/0017 |

* cited by examiner

DISPLAY DEVICE WITH THIN THICKNESS AND SLIM BEZEL AND OUTER BEZEL FRAME THEREOF

BACKGROUND OF THE DISCLOSURE

1. Field of the Disclosure

The present disclosure relates to a display device, and more particularly, to a display device with a thin thickness and a slim bezel, and an outer bezel frame thereof.

2. Description of the Prior Art

A thin and lightweight design has become a development trend of an electronic device. Taking a display device as an example, in order to meet requirements of modern aesthetics with a thin and lightweight design, a thickness of the display device is reduced as much as possible to make the display device look more elegant and fashionable. Therefore, reducing an overall thickness of a display device becomes an important topic in the display field.

Furthermore, currently, a display device usually has a slim bezel to increase a screen-to-body ratio thereof to make the display device look wider and provide a better visual experience for a user. However, accumulation of assembly tolerances of the display device cannot result in a uniform gap between the slim bezel and a display panel, which causes a negative effect on the user's visual experience.

SUMMARY OF THE DISCLOSURE

Therefore, the present disclosure aims at providing a display device with a thin thickness and a slim bezel, and an outer bezel frame thereof for solving the aforementioned problem.

In order to achieve the aforementioned objective, the present disclosure discloses a display device with a thin thickness and a slim bezel including a backlight module, a rear casing, an outer bezel frame and a panel module. The backlight module includes a back plate and a light emitting assembly disposed on the back plate and configured to emit light beams. The rear casing covers the backlight module. The outer bezel frame includes a bezel body, at least one first fixing portion and at least one second fixing portion. The at least one first fixing portion and the at least one second fixing portion are disposed on a rear side of the bezel body and spaced apart from each other. The at least one first fixing portion is fixed to the back plate in a lateral direction. The at least one second fixing portion is located at a side of the at least one first fixing portion away from the backlight module and fixed to the rear casing in the lateral direction. The panel module is fixed on a front side of the bezel body opposite to the rear side of the bezel body and configured to display images.

According to an embodiment of the present disclosure, the back plate includes a back plate back portion and a back plate lateral portion. The back plate lateral portion is connected to the back plate back portion and adjacent to an outer periphery of the back plate back portion, and the back plate lateral portion is fixed to the at least one first fixing portion.

According to an embodiment of the present disclosure, at least one engaging hook protrudes from the back plate lateral portion. At least one engaging hole is formed on the at least one first fixing portion, and the back plate lateral portion and the at least one first fixing portion are engaged with each other by engagement of the at least one engaging hook and the at least one engaging hole.

According to an embodiment of the present disclosure, at least one engaging hole is formed on the back plate lateral portion. At least one engaging hook protrudes from the at least one first fixing portion, and the back plate lateral portion and the at least one first fixing portion are engaged with each other by engagement of the at least one engaging hole and the at least one engaging hook.

According to an embodiment of the present disclosure, the outer bezel frame further includes at least one rear restraining portion disposed on the rear side of the bezel body. The at least one rear restraining portion is located at a side of the back plate lateral portion away from the at least one first fixing portion, and the back plate lateral portion is restrained between the at least one first fixing portion and the at least one rear restraining portion when the back plate lateral portion is fixed to the at least one first fixing portion.

According to an embodiment of the present disclosure, a length of the at least one first fixing portion is less than a length of the back plate lateral portion.

According to an embodiment of the present disclosure, the outer bezel frame does not contact with the back plate back portion.

According to an embodiment of the present disclosure, the rear casing includes a rear casing back portion and a rear casing lateral portion. The rear casing lateral portion is connected to the rear casing back portion and adjacent to an outer periphery of the rear casing back portion, and the rear casing lateral portion is fixed to the at least one second fixing portion.

According to an embodiment of the present disclosure, at least one engaging hole is formed on the rear casing lateral portion. At least one engaging hook protrudes from the at least one second fixing portion, and the rear casing lateral portion and the second first fixing portion are engaged with each other by engagement of the at least one engaging hole and the at least one engaging hook.

According to an embodiment of the present disclosure, at least one engaging hook protrudes from the rear casing lateral portion. At least one engaging hole is formed on the at least one second fixing portion, and the rear casing lateral portion and the at least one second fixing portion are engaged with each other by engagement of the at least one engaging hook and the at least one engaging hole.

According to an embodiment of the present disclosure, the at least one first fixing portion is located at a side of the rear casing lateral portion away from the at least one second fixing portion, and the rear casing lateral portion is restrained between the at least one second fixing portion and the at least one first fixing portion when the rear casing lateral portion is fixed to the at least one second fixing portion.

According to an embodiment of the present disclosure, the rear casing back portion is fixed to the outer bezel frame in a contacting manner when the rear casing lateral is fixed to the at least one second fixing portion.

According to an embodiment of the present disclosure, the display device further includes at least one adhesive component disposed on the front side of the bezel body, and the panel module is attached onto the front side of the bezel body by the at least one adhesive component.

According to an embodiment of the present disclosure, the outer bezel frame further includes at least one front restraining portion disposed on the front side of the bezel body to restrain movement of the at least one adhesive component.

According to an embodiment of the present disclosure, the bezel body is a surrounding structure. The outer bezel frame includes a plurality of first fixing portions disposed on and surrounding the rear side of the bezel body along a surrounding direction. The plurality of first fixing portions are spaced apart from one another. The plurality of first fixing portions are fixed to an outer periphery of the back plate of the backlight module, and the at least one second fixing portion surrounds the rear side of the bezel body and fixed to an outer periphery of the rear casing.

According to an embodiment of the present disclosure, the outer bezel frame includes a plurality of second fixing portions disposed on and surrounding the rear side of the bezel body along the surrounding direction, and the plurality of second fixing portions are spaced apart from one another.

According to an embodiment of the present disclosure, the outer bezel frame further includes a front bezel portion disposed on the front side of the bezel body, and a gap is formed between the front bezel portion and the panel module when the panel module is fixed on the front side of the bezel body.

According to an embodiment of the present disclosure, the at least one second fixing portion is restrained between the rear casing and the backlight module when the rear casing and the backlight module are fixed to the at least one second fixing portion and the at least one first fixing portion respectively.

According to an embodiment of the present disclosure, the display device further includes a screw component. A through hole is formed on the rear casing. A screw hole is formed on the outer bezel frame and corresponding to the through hole, and the screw component passes through the through hole to be screwed onto the screw hole, so as to fix the rear casing and the outer bezel frame.

In order to achieve the aforementioned objective, the present disclosure discloses an outer bezel frame configured to fix a backlight module and a rear casing of a display device. The outer bezel frame includes a bezel body, at least one first fixing portion and at least one second fixing portion. The at least one first fixing portion is disposed on a rear side of the bezel body to fix the backlight module in a lateral direction. The at least one second fixing portion is disposed on the rear side of the bezel body and spaced apart from the at least one first fixing portion. The at least one second fixing portion is configured to fix the rear casing in the lateral direction.

According to an embodiment of the present disclosure, the at least one first fixing portion is located at a side of the rear casing away from the at least one second fixing portion, and the rear casing is restrained between the at least one second fixing portion and the at least one first fixing portion when the rear casing is fixed to the at least one second fixing portion.

According to an embodiment of the present disclosure, the outer bezel frame further includes at least one rear restraining portion disposed on the rear side of the bezel body. The at least one rear restraining portion is located at a side of the backlight module away from the at least one first fixing portion, and the backlight module is restrained between the at least one first fixing portion and the at least one rear restraining portion when the backlight module is fixed to the at least one first fixing portion.

According to an embodiment of the present disclosure, the bezel body is a surrounding structure. The outer bezel frame includes a plurality of first fixing portions. The plurality of first fixing portions are disposed on and surround the rear side of the bezel body along in a surrounding direction to fix an outer periphery of the backlight module, the plurality of first fixing portions are disposed on and surround the rear side of the bezel body are spaced apart from one another, and the at least one second fixing portion surrounds the rear side of the bezel body to fix an outer periphery of the rear casing.

According to an embodiment of the present disclosure, the outer bezel frame includes a plurality of second fixing portions disposed on and surrounding the rear side of the bezel body along the surrounding direction, and the plurality of second fixing portions are spaced apart from one another.

According to an embodiment of the present disclosure, the at least one second fixing portion is located between the rear casing and the back plate when the rear casing and the back plate are fixed to the at least one second fixing portion and the at least one first fixing portion respectively.

In summary, the present disclosure utilizes the first fixing portion and the second fixing portion to respectively fix the backlight module and the rear casing onto the rear side of the bezel body and further utilizes the adhesive component to fix the panel module onto the front side of the bezel body. Such configuration can not only reduce an overall thickness of the display device to meet requirements of modern aesthetics but also solve a problem of accumulation of assembly tolerances in the prior art to achieve the uniform gap between the panel module and the front bezel portion of the outer bezel frame and control a size of the gap within a certain range, such as 0.2 millimeters, for providing a better visual experience to a user. Furthermore, the outer bezel frame can replace an outer frame of a conventional display device and a middle frame of a conventional backlight module in the prior art, so that the number of the components of the display device can be reduced, and the number of the assembly processes of the components of the display device can be simplified. Therefore, the present disclosure has advantages of simple structure and easy assembly to allow the user to assemble the display device easily.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
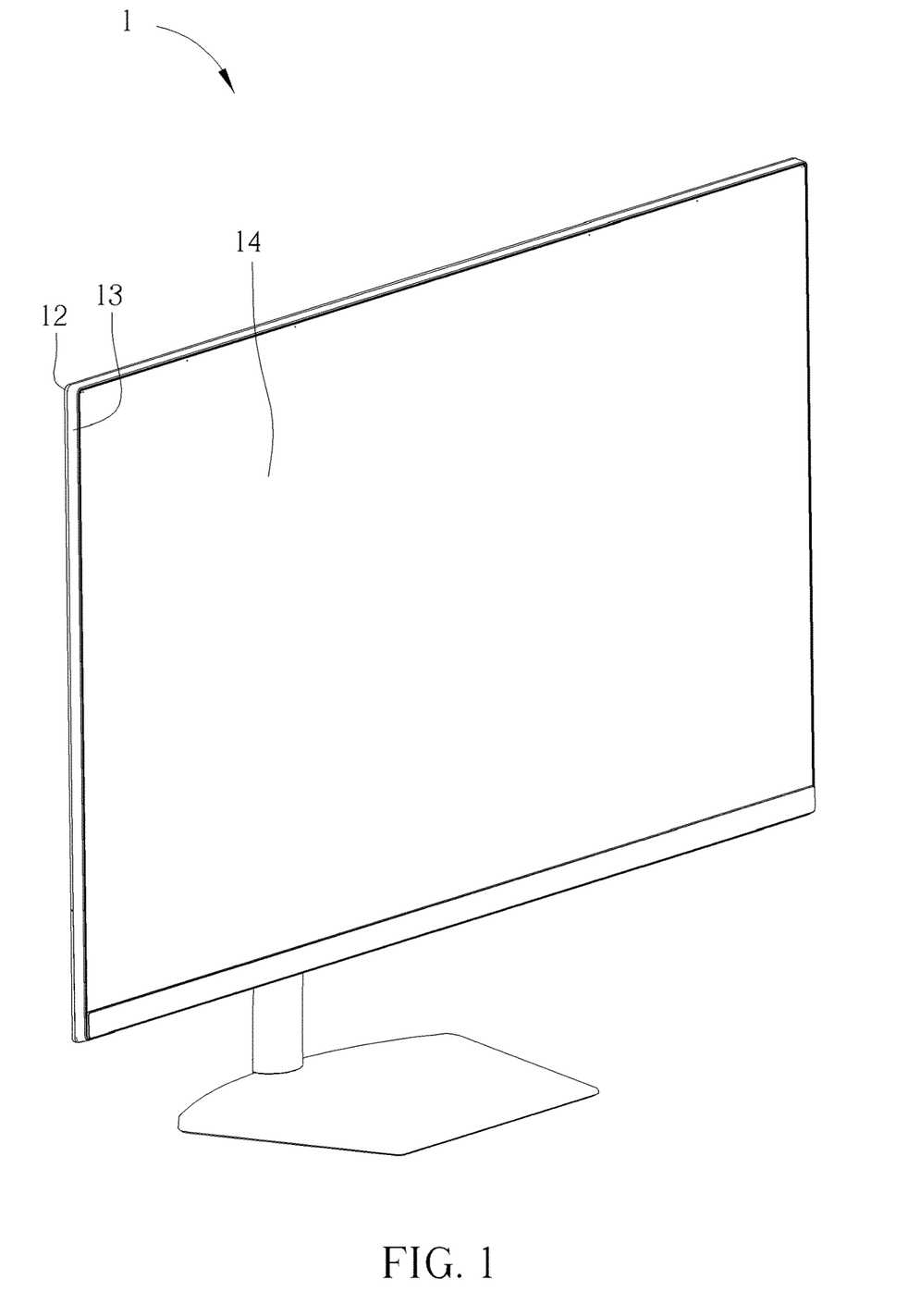
FIG. 1 is a schematic diagram of a display device according to a first embodiment of the present disclosure.
Figure 2:
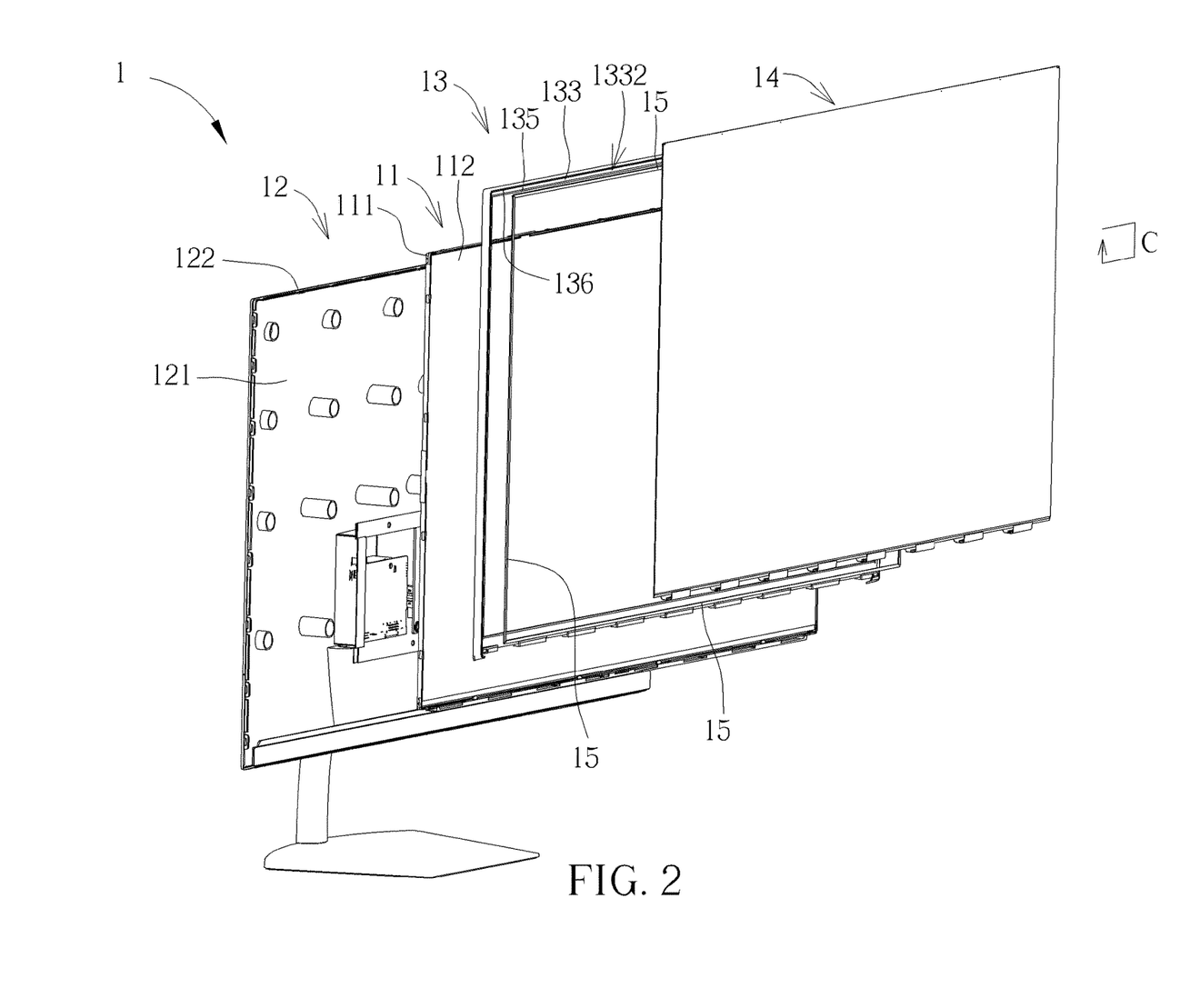
FIG. 2 and FIG. 3 are exploded diagrams of the display device at different views according to the first embodiment of the present disclosure.
Figure 3:
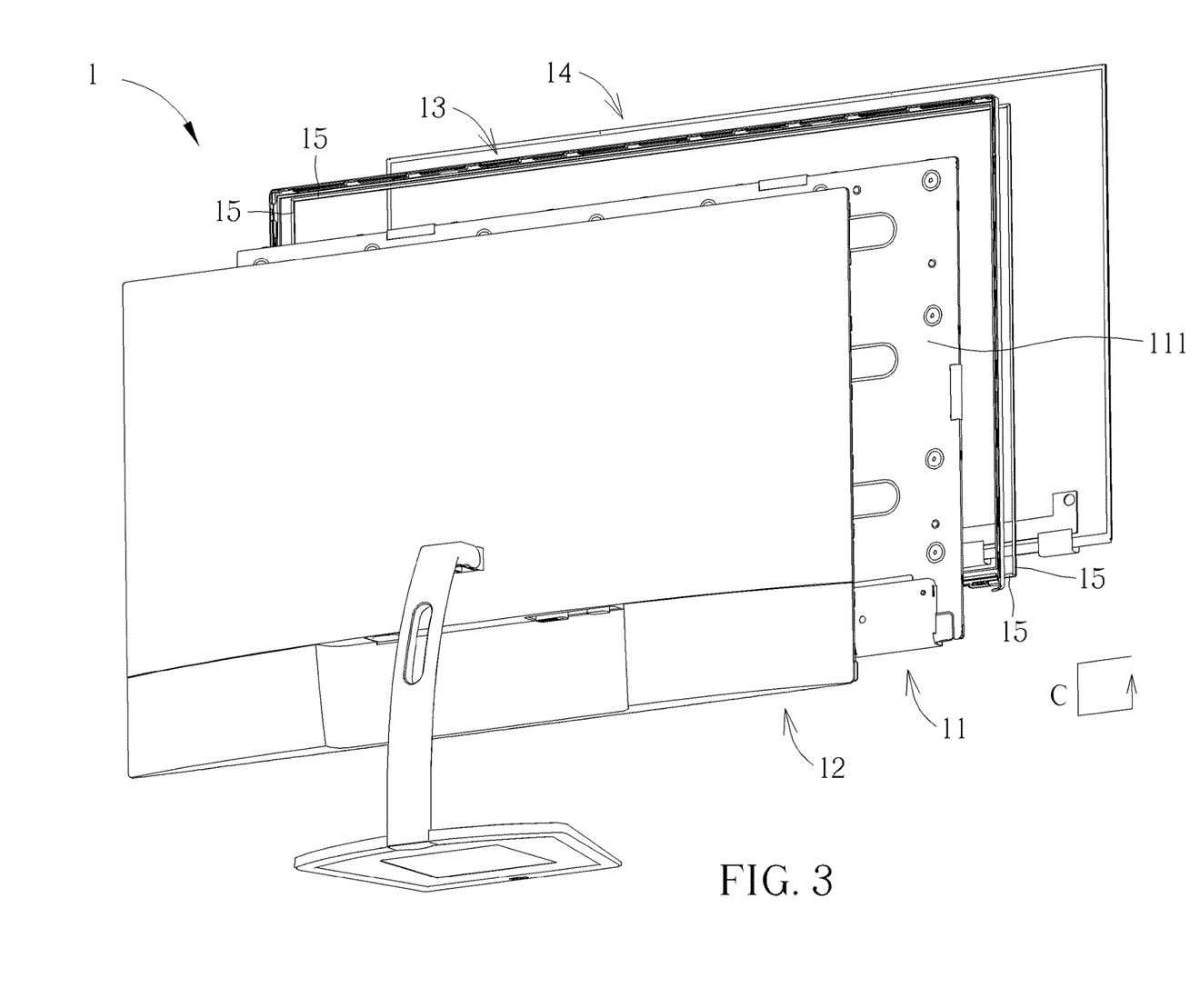

As shown in FIG. 1 to FIG. 3, in this embodiment, a display device 1 can be a desktop monitor. However, it is not limited thereto. The display device 1 also can be a vehicle monitor, a commercial monitor, a liquid crystal display (LCD) monitor, a laptop monitor or an all-in-one computer monitor. The display device 1 includes a backlight module 11, a rear casing 12, an outer bezel frame 13 and a panel module 14. The backlight module 11 includes a back plate 111 and a light emitting assembly 112 disposed on the back plate 111 and configured to emit light beams. In this embodiment, the light emitting assembly 112 can include various optical components, such as light emitting components, light reflecting components, light conductive components and optical films. However, it is not limited thereto. The rear casing 12 covers the backlight module 11. The outer bezel frame 13 can include a plurality of first fixing portions 131, a second fixing portion 132 and a bezel body 133. In this embodiment, the bezel body 133 can preferably be a surrounding structure and has a rear side 1331 and a front side 1332 opposite to the rear side 1331. The plurality of first fixing portions 131 can be disposed on and surround the rear side 1331 of the bezel body 133 along a surrounding direction C, and the plurality of first fixing portions 131 are spaced apart from one another, so as to fix to an outer periphery of the back plate 111 of the backlight module 11. The second fixing portion 132 surrounds the rear side 1331 of the bezel body 133 and located at a side of the plurality of first fixing portions 131 away from the backlight module 11 to fix to an outer periphery of the rear casing 12. That is, the second fixing portion 132 and the plurality of first fixing portions 131 are spaced apart from each other in a direction perpendicular to the surrounding direction C. The panel module 14 is fixed on the front side 1332 of the bezel body 133 and is configured to display images. However, in another embodiment, the outer bezel frame 13 may only include one first fixing portion 131. The bezel body can be a U-shaped structure with an opening. The first fixing portion and the second fixing portion can be located on one segment of the U-shaped structure.

In this embodiment, an upper side, a lower side, a left side and a right side of the display device 1 can have similar structures. Detailed description for the structure of the upper side of the display device 1 is provided as follows for simplicity. As shown in FIG. 2 to FIG. 5, and FIG. 7, the first fixing portions 131 and the second fixing portion 132 are disposed on the rear side 1331 of the bezel body 133 and spaced apart from each other in a lateral direction R perpendicular to the surrounding direction C. The first fixing portions 131 and the second fixing portion 132 are substantially perpendicular to the bezel body 133. The back plate 111 includes a back plate back portion 1111 and a back plate lateral portion 1112. The back plate lateral portion 1112 is connected to the back plate back portion 1111 and adjacent to an outer periphery of the back plate back portion 1111. The back plate lateral portion 1112 is substantially perpendicular to the back plate back portion 1111 and parallel to the plurality of first fixing portions 131. A plurality of engaging hooks 1112A protrude from the back plate lateral portion 1112. An engaging hole 1311 is formed on each first fixing portion 131. In such a way, the back plate lateral portion 1112 and the plurality of first fixing portions 131 can be engaged with each other along the lateral direction R by engagement of the plurality of engaging hooks 1112A and the plurality of engaging holes 1311. However, in another embodiment, the numbers of the engaging hook and the engaging hole can be one. Alternatively, in another embodiment, the engaging hook can be disposed on the first fixing portion 131, and the engaging hole can be formed on the back plate lateral portion 1112, so that the back plate lateral portion 1112 and the first fixing portion 131 also can be engaged with each other in the lateral direction R by engagement of the engaging hole and the engaging hook.

Figure 4:
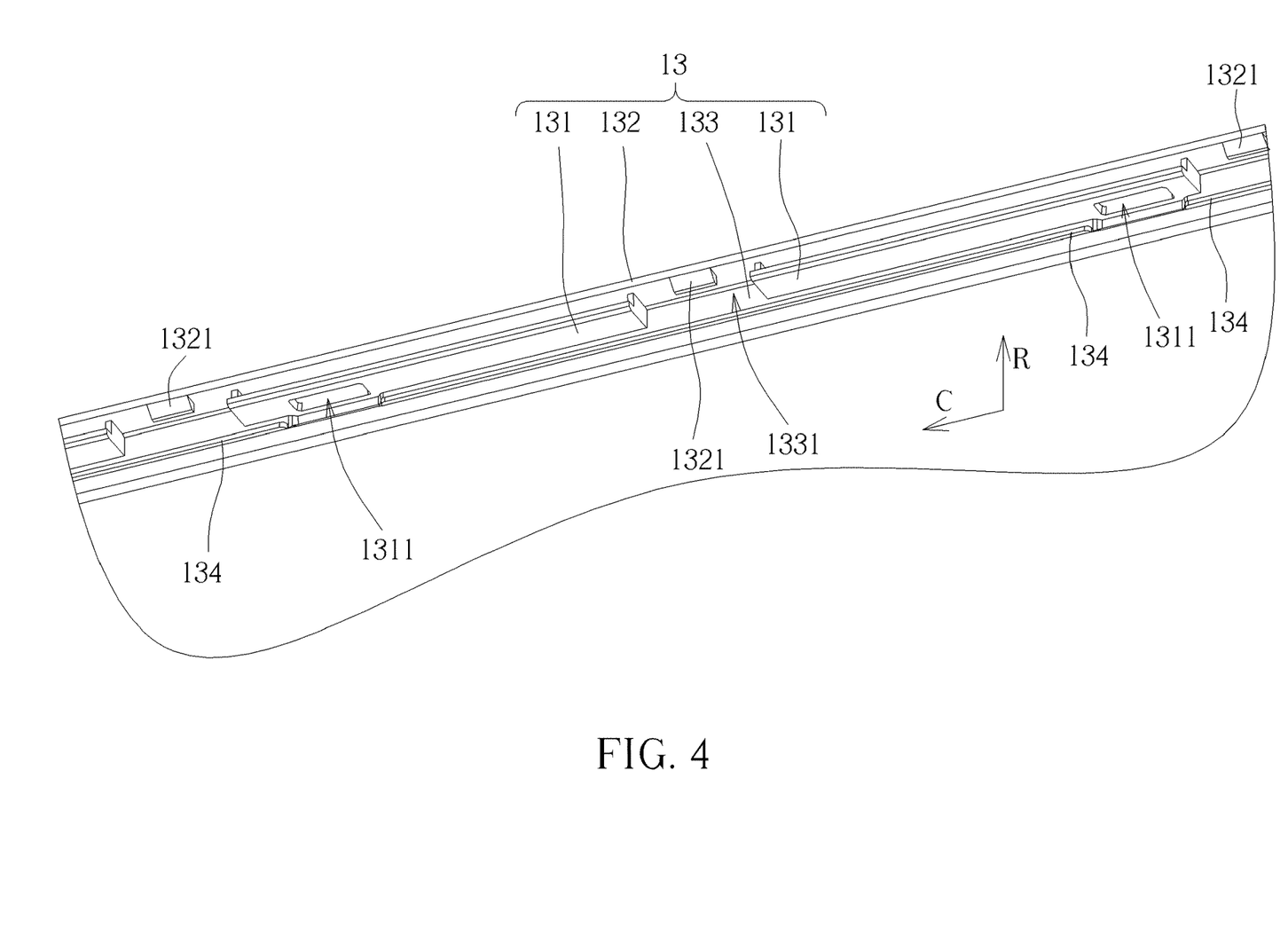
FIG. 4 is a partial enlarged diagram of an outer bezel frame according to the first embodiment of the present disclosure.
Figure 5:
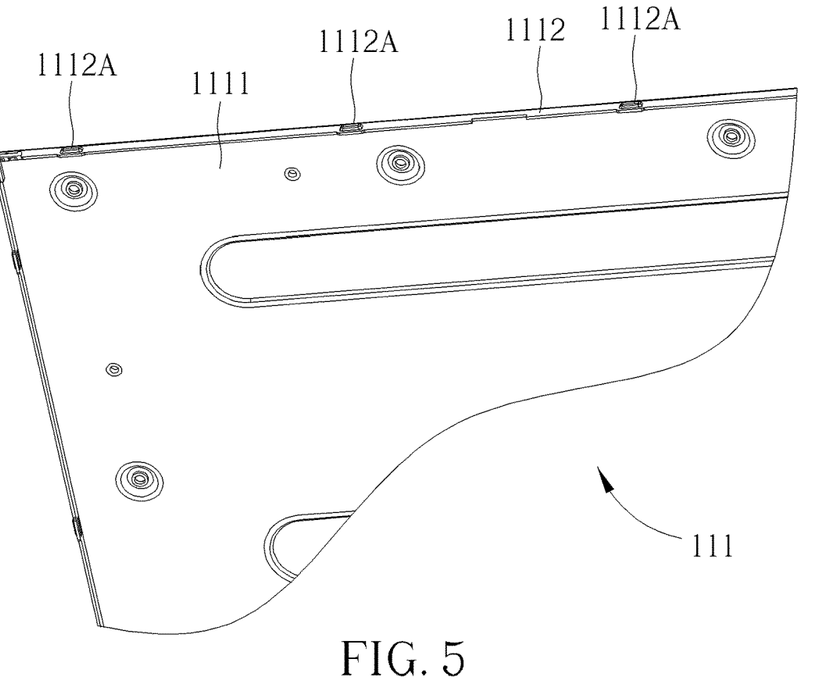
FIG. 5 is a partial enlarged diagram of a back plate according to the first embodiment of the present disclosure.
Figure 6:
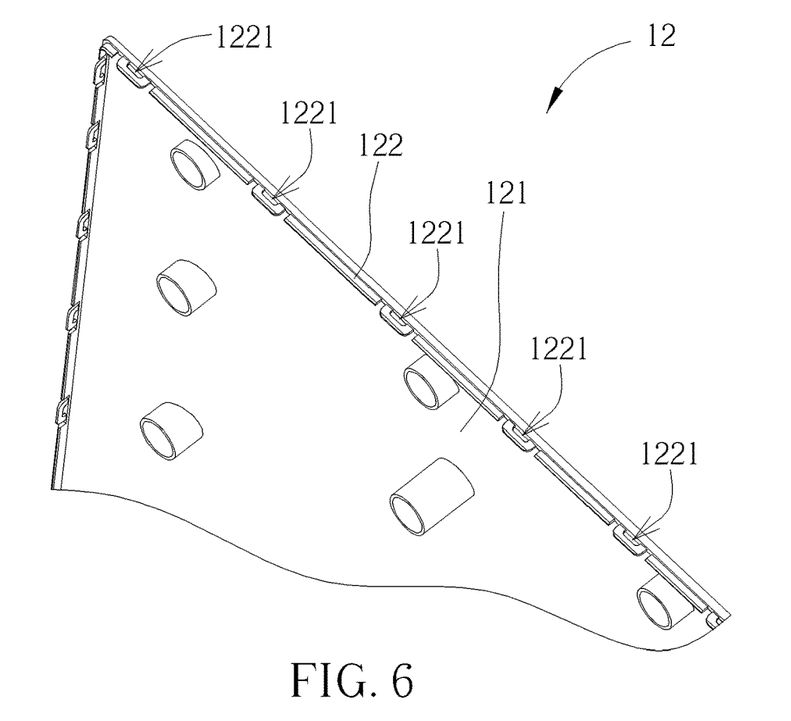
FIG. 6 is a partial enlarged diagram of a rear casing according to the first embodiment of the present disclosure.
Figure 7:
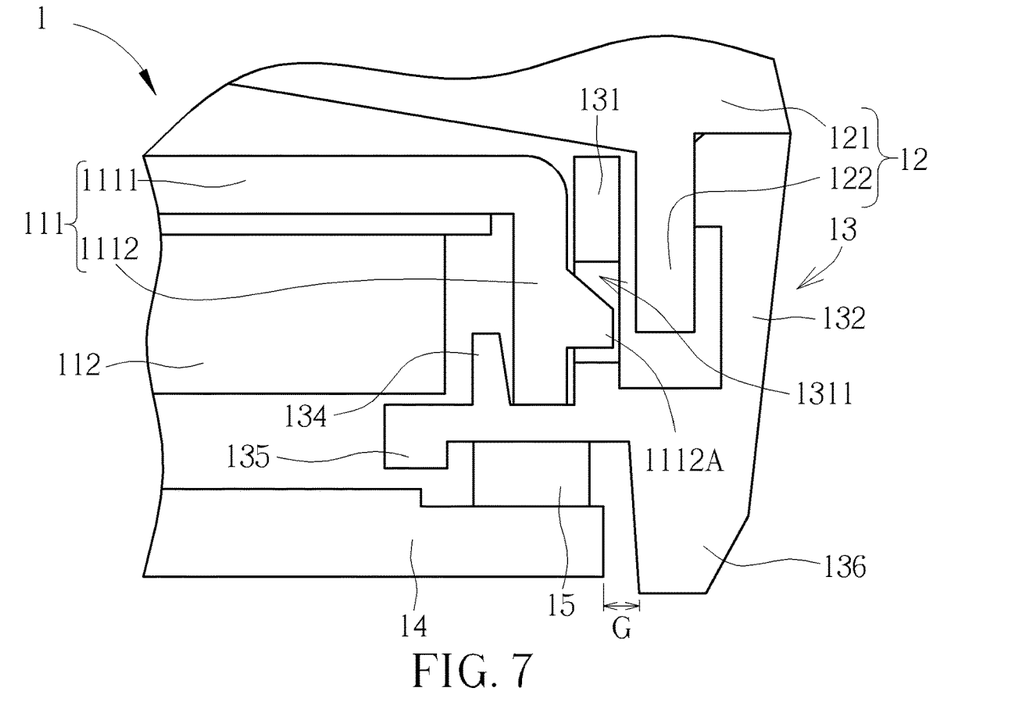
FIG. 7 and FIG. 8 are sectional diagrams of the display device at different views according to the first embodiment of the present disclosure.

It should be noticed that, in this embodiment, the outer bezel frame 13 can further include a plurality of rear restraining portions 134 disposed on the rear side 1331 of the bezel body 133 along the surrounding direction C. The plurality of restraining portions 134 are located at a side of the back plate lateral portion 1112 away from the plurality of first fixing portions 131. That is, the plurality of rear restraining portions 134 and the second fixing portion 132 are respectively located at two opposite sides of the plurality of first fixing portions 131. The plurality of first fixing portions 131 and the plurality of rear restraining portions 134 are configured along the direction perpendicular to the surrounding direction C, and the plurality of first fixing portions 131 and the plurality of rear restraining portions 134 are spaced apart from one another. In such a way, the back plate lateral portion 1112 can be restrained between the plurality of first fixing portions 131 and the plurality of rear restraining portion 134 when the back plate lateral portion 1112 is fixed on the plurality of first fixing portions 131. However, in another embodiment, the outer bezel frame also can only include one rear restraining portion located at a position corresponding to any one of the plurality of first fixing portions 131. Alternatively, the rear restraining portion even can be omitted. It depends on practical demands. Furthermore, in this embodiment, a length of the first fixing portion 131 may be less than a length of the back plate lateral portion 1112, such that an overall thickness of the display device 1 may not be increased due to the length of the first fixing portion 131. Furthermore, in this embodiment, the outer bezel frame 13 cannot contact with the back plate back portion 1111 when the back plate lateral portion 1112 and the plurality of first fixing portions 131 are engaged with each other in the lateral direction R, such that the overall length of the display device 1 may not be increased.

Furthermore, as shown in FIG. 2 to FIG. 4, FIG. 6 and FIG. 8, the rear casing 12 includes a rear casing back portion 121 and a rear casing lateral portion 122. The rear casing lateral portion 122 is connected to the rear casing back portion 121 and adjacent to an outer periphery of the rear casing back portion 121. The rear casing lateral portion 122 is substantially parallel to the second fixing portion 132. A plurality of engaging holes 1221 are formed on the rear casing lateral portion 122. A plurality of engaging hooks 1321 protrude from the second fixing portion 132. In such a way, the rear casing lateral portion 122 and the second fixing portion 132 can be engaged with each other in the lateral direction R by engagement of the plurality of engaging holes 1221 and the plurality of engaging hooks 1321. It should be noticed that, in this embodiment, the plurality of first fixing portions 131 can be located at a side of the rear casing lateral portion 122 away from the second fixing portion 132, so that the rear casing lateral portion 122 can be restrained between the second fixing portion 132 and the plurality of first fixing portions 131 when the rear casing lateral portion 122 is fixed to the second fixing portion 132. Besides, in this embodiment, the rear casing back portion 121 can contact with a side of the second fixing portion 132 of the outer bezel frame 13 when the rear casing lateral portion 122 is fixed to the second fixing portion 132 of the outer bezel frame 13, so that the outer bezel frame 13 and the rear casing 12 can contact with each other seamlessly for enhancing appearance aesthetics of the display device 1. However, in another embodiment, the numbers of the engaging hook and the engaging hole can be one. Alternatively, in another embodiment, the engaging hook can be disposed on the rear casing lateral portion 122, and the engaging hole can be formed on the second fixing portion 132, so that the rear casing lateral portion 122 and the second fixing portion 132 also can be engaged with each other in the lateral direction R by engagement of the engaging hook and the engaging hole.

Figure 8:
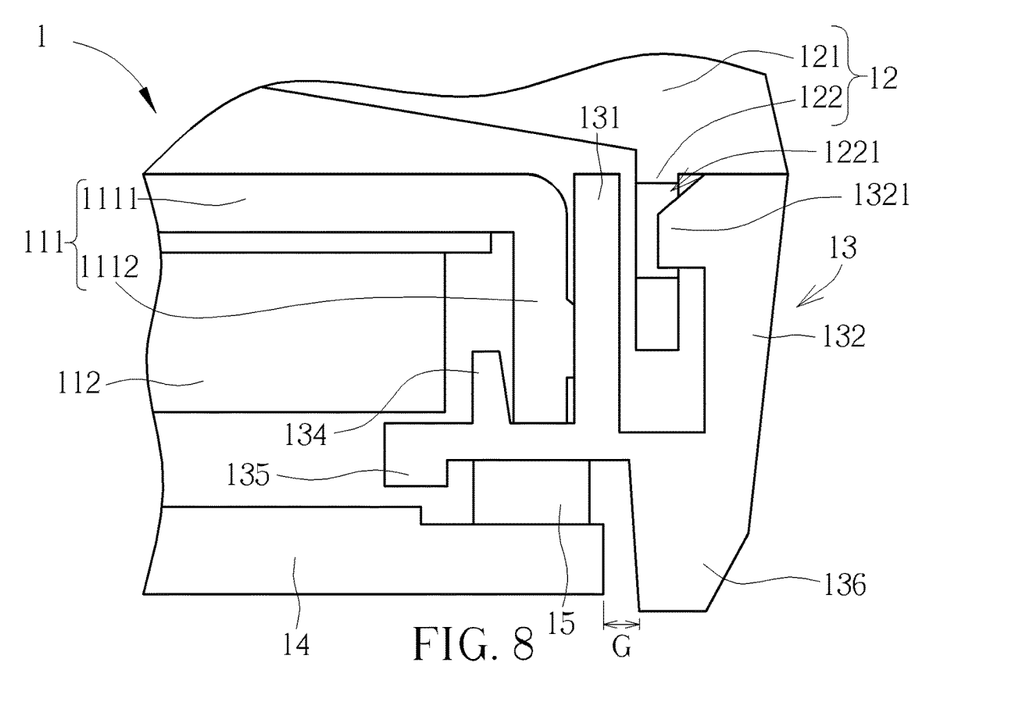

Moreover, the display device 1 further includes at least one adhesive component 15 for fixing the panel module 14 on the bezel body 133. For example, in this embodiment, the display device 1 can include four adhesive components 15 disposed on the front side 1332 of the bezel body 133, and the panel module 14 is attached onto the front side 1332 of the bezel body 133 by the four adhesive components 15. Furthermore, in this embodiment, the outer bezel frame 13 can further include a front restraining portion 135 and a front bezel portion 136. The front restraining portion 135 and the front bezel portion 136 are disposed on the front side 1332 of the bezel body 133. The front restraining portion 135 is configured to restrain movements of the adhesive components 15. A gap G is formed between the front bezel portion 136 and the panel module 14 when the panel module 14 is fixed on the front side 1332 of the bezel body 133 by the adhesive components 15. A restraining space is formed between the front restraining portion 135 and the front bezel portion 136. The adhesive components 15 are located inside the restraining space, so that the movements of the adhesive components can be restrained by the front restraining portion 135 and the front bezel portion 136, so as to restrain movement of the panel module 14 relative to the outer bezel frame 13. The uniform gap G between the front bezel portion 136 and the panel module 14 can be achieved.

As for the structures of the lower side, the left side and the right side of the display device 1, since the structures of the lower side, the left side and the right side of the display device 1 are similar to the structure of the top side of the display device 1, detailed description for the structures of the lower side, the left side and the right side of the display device 1 is omitted herein for simplicity.

When it is desired to assemble the display device 1, the adhesive components 15 can be disposed inside the restraining space on the front side 1332 of the bezel body 133. Afterwards, the backlight module 11 can be fixed to the outer bezel frame 13 by engagement of the back plate lateral portion 1112 and the first fixing portion 131, and the panel module 14 can be attached on the outer bezel frame 13 by the adhesive components 15. After other components, such as a shielding cover, have been well assembled, the rear casing 12 can be fixed to the outer bezel frame 13 by engagement of the rear casing lateral portion 122 and the second fixing portion 132 to complete assembly of the display device 1. Therefore, the present disclosure has advantages of simple structure and easy assembly.

Figure 9:
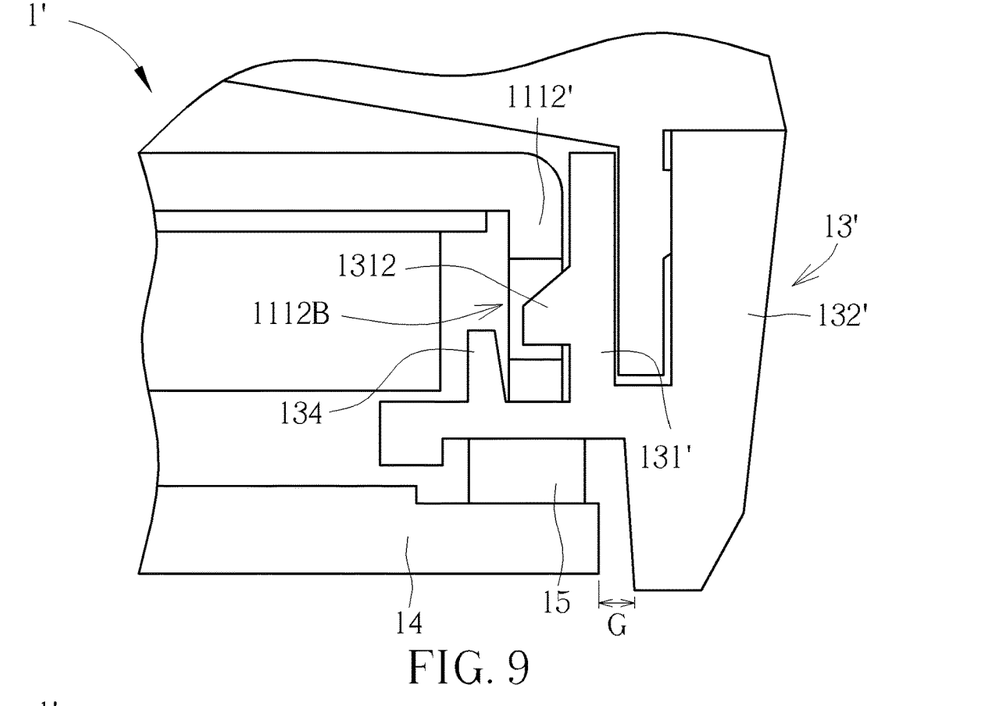
FIG. 9 and FIG. 10 are sectional diagrams of a display device at different views according to a second embodiment of the present disclosure.
Figure 10:
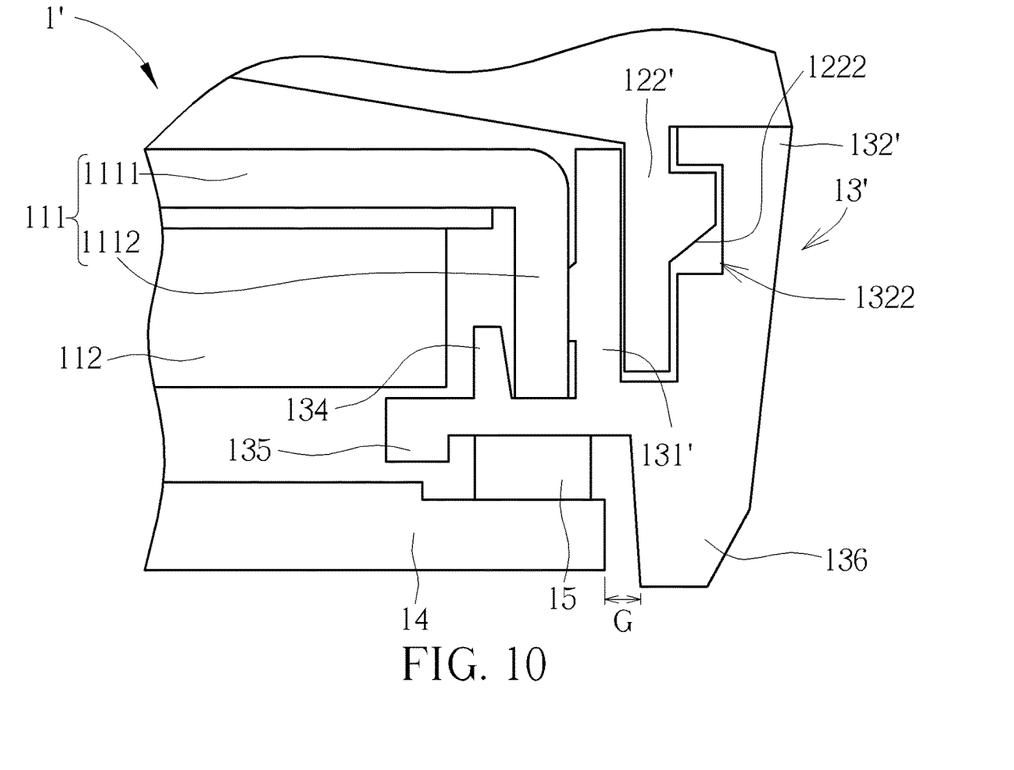

However, the fixing mechanism of the backlight module 11 and the outer bezel frame 13, and the fixing mechanism of the rear casing 13 and the outer bezel frame 13 are not limited to the aforementioned embodiment. For example, as shown in FIG. 9 and FIG. 10, in this embodiment, a plurality of engaging holes 1112B are formed on a back plate lateral portion 1112' of a display device 1', and an engaging hook 1312 protrudes from each first fixing portion 131' of an outer bezel frame 13' of the display device 1', so that the back plate lateral portion 1112' and the plurality of first fixing portions 131' can be engaged with each other by engagement of the plurality of engaging holes 1112B and the plurality of engaging hooks 1312. Furthermore, a plurality of engaging hooks 1222 protrude from a rear casing lateral portion 122' of the display device 1', and a plurality of engaging holes 1322 are formed on a second fixing portion 132' of the outer bezel frame 13', so that the rear casing lateral portion 122' and the second fixing portion 132' can be engaged with each other by the plurality of engaging hooks 1222 and the plurality of engaging holes 1322. However, in another embodiment, the number of the engaging hook and the number of the engaging hole can be one.

Furthermore, understandably, the back plate lateral portion of the backlight module and the first fixing portion of the outer bezel frame also can be fixed to each other by a fixing mechanism, such as screwing, sticking or insert molding, other than the aforementioned engaging mechanism of the engaging hook and the engaging hole. Similarly, the rear casing lateral portion of the rear casing and the second fixing portion of the outer bezel frame can be fixed to each other by a fixing mechanism, such as screwing, sticking or insert molding, other than the aforementioned engaging mechanism of the engaging hook and the engaging hole.

Figure 11:
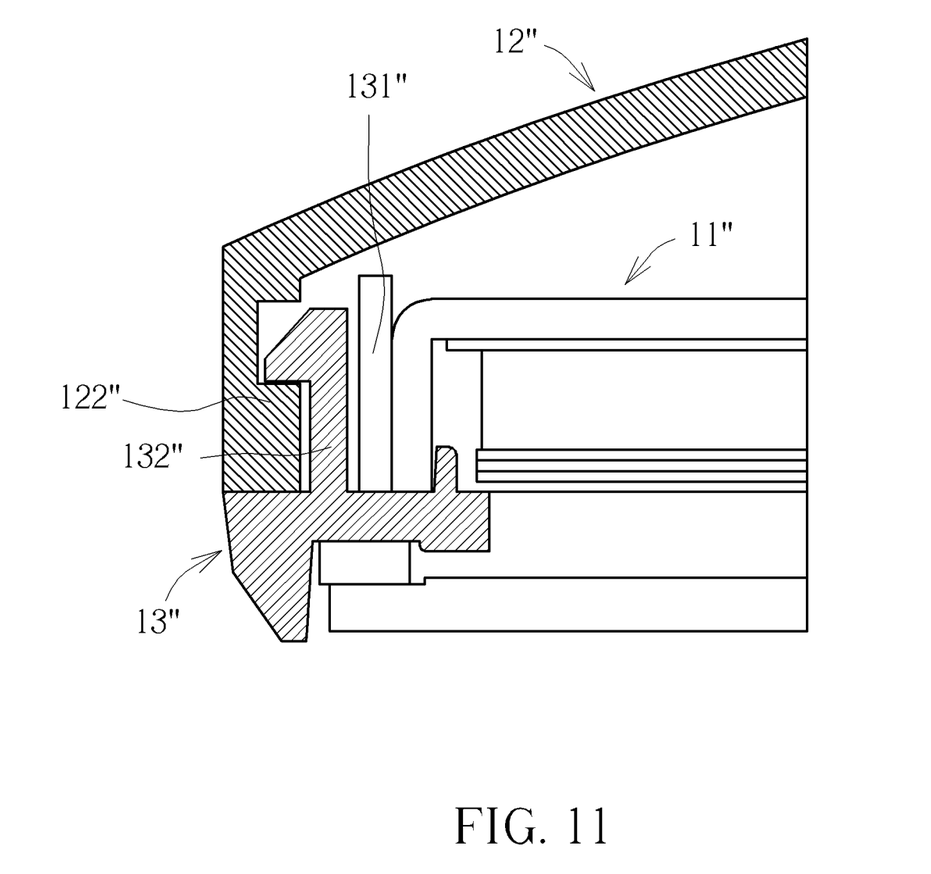
FIG. 11 is a partial sectional diagram of a display device according to a third embodiment of the present disclosure.
Figure 12:
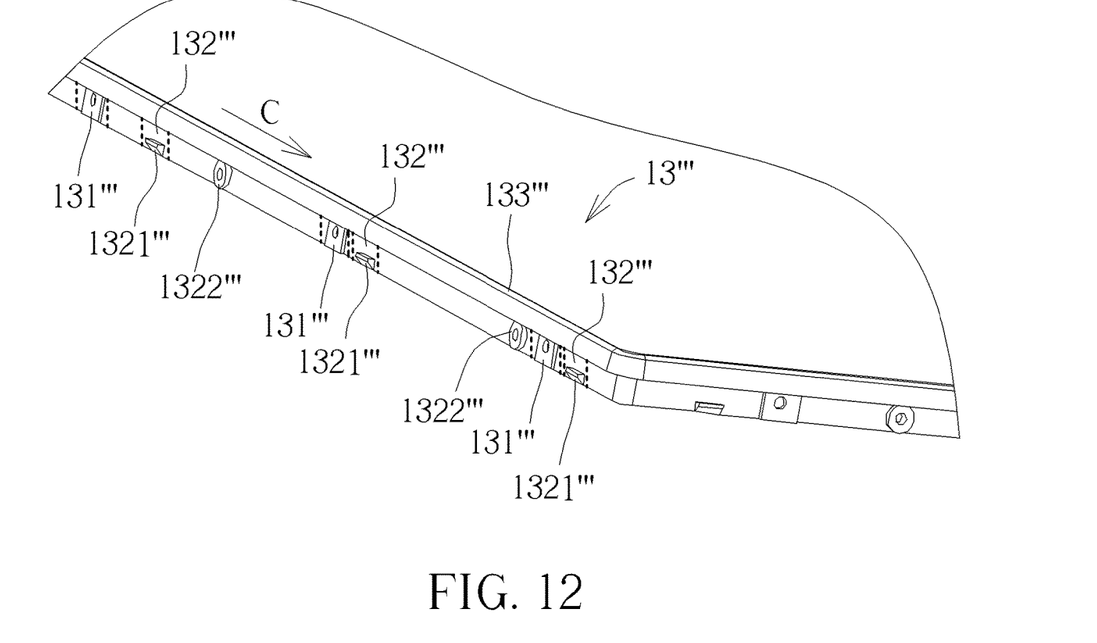
FIG. 12 is a partial enlarged diagram of an outer bezel frame according to a fourth embodiment of the present disclosure.
Figure 13:
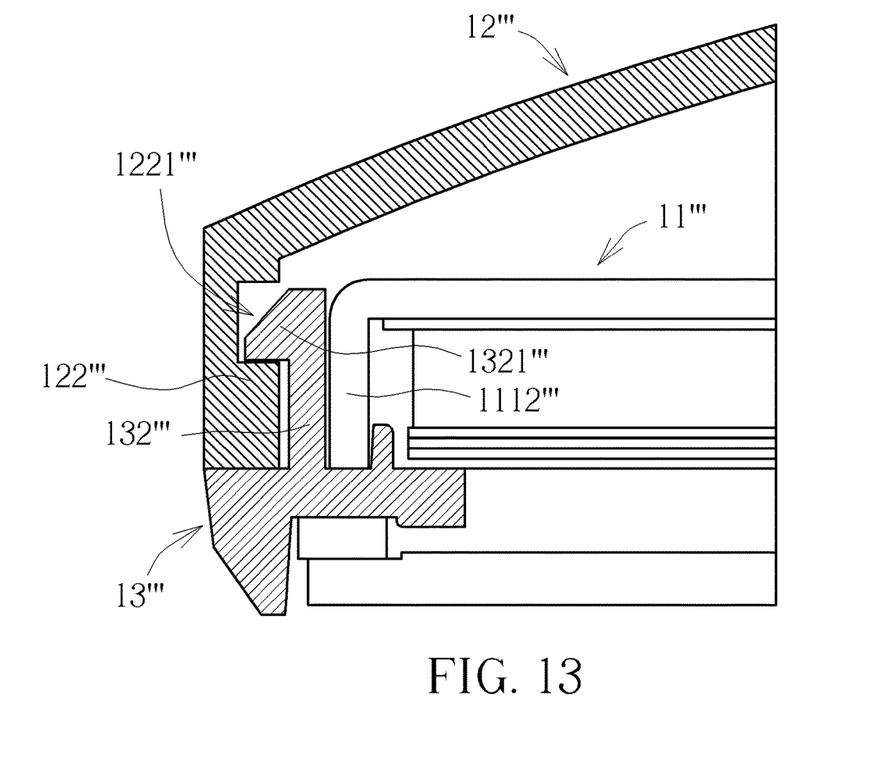
FIG. 13 to FIG. 15 are partial sectional diagrams of a display device at different views according to the fourth embodiment of the present disclosure.
Figure 14:
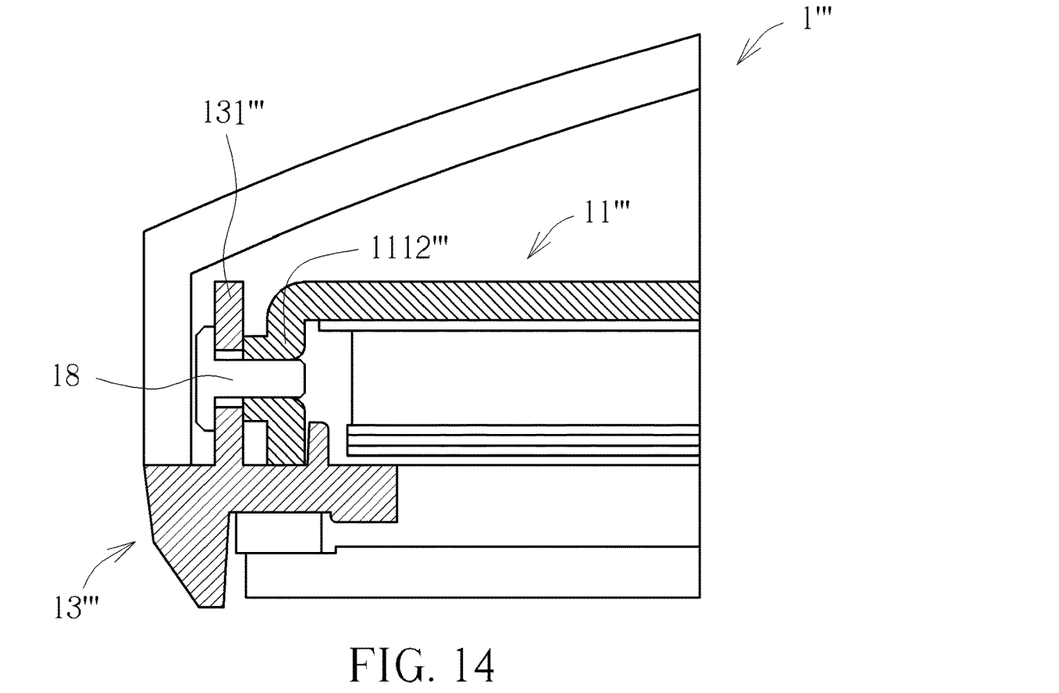
Figure 15:
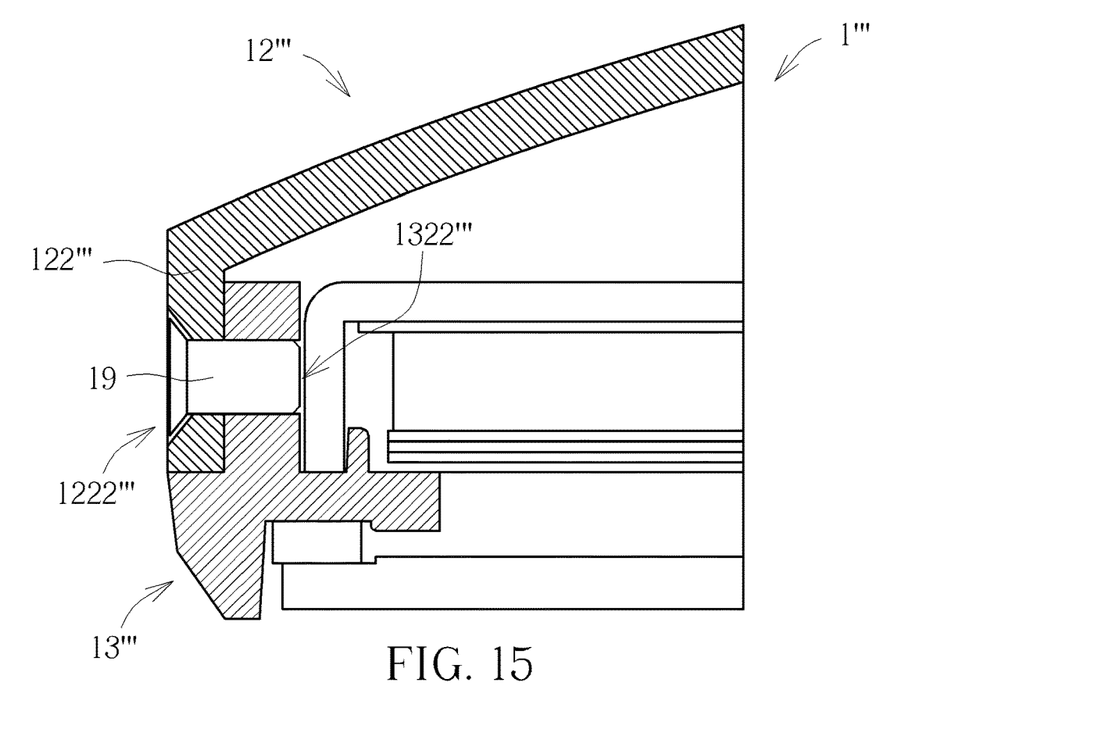

In another example, as shown in FIG. 11, different from the aforementioned embodiments, a rear casing lateral portion 122" of a rear casing 12" in this embodiment is located an outer side of a second fixing portion 132" away from a backlight module 11" and covers the second fixing portion 132". In other words, the second fixing portion 132" is restrained between the rear casing 12" and the backlight module 11" when the rear casing 12" and the backlight module 11" are fixed to the second fixing portion 132" and a first fixing portion 131" of an outer bezel frame 13" respectively.

In another example, as shown in FIG. 12 to FIG. 15, different from the aforementioned embodiments, in this embodiment, an outer bezel frame 13''' includes a plurality of first fixing portions 131''', a plurality of second fixing portions 132''' and a bezel body 133'''. The plurality of first fixing portions 131''' and the plurality of second fixing portions 132''' are spaced apart from each other along the surrounding direction C and form an integral structure on the bezel body 133'''. The first fixing portion 131''' is fixed to a back plate lateral portion 1112''' of a backlight module 11''' by a screw component 18, and the second fixing portion 132''' is fixed to a rear casing lateral portion 122''' by engagement of an engaging hook 1321''' on the second fixing portion 132''' and an engaging hole 1221''' on the rear casing lateral portion 122'''. Furthermore, in this embodiment, a display device 1''' can further include a screw component 19. A through hole 1222''' is formed on the rear casing lateral portion 122'''. A screw hole 1322''' is formed on the outer bezel frame 13''' and corresponding to the through hole 1222''', and the screw component 19 passes through the through hole 1222''' to be screwed onto the screw hole 1322''', so as to fix a rear casing 12''' and the outer bezel frame 13'''.

In contrast to the prior arts, the present disclosure utilizes the first fixing portion and the second fixing portion to respectively fix the backlight module and the rear casing onto the rear side of the bezel body and further utilizes the adhesive component to fix the panel module onto the front side of the bezel body. Such configuration can not only reduce an overall thickness of the display device to meet requirements of modern aesthetics but also solve a problem of accumulation of assembly tolerances in the prior arts to achieve the uniform gap between the panel module and the front bezel portion of the outer bezel frame and control a size of the gap within a certain range, such as 0.2 millimeters, for providing a better visual experience to a user. Furthermore, the outer bezel frame can replace an outer frame of a conventional display device and a middle frame of a conventional backlight module in the prior arts, so that the number of the components of the display device can be reduced, and the number of the assembly process of the components of the display device can be simplified. Therefore, the present disclosure has advantages of simple structure and easy assembly to allow the user to assemble the display device easily.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device comprising:
   a backlight module comprising a back plate and a light emitting assembly disposed on the back plate and configured to emit light beams;
   a rear casing covering the backlight module;
   an outer bezel frame comprising a bezel body, at least one first fixing portion and at least one second fixing portion, the at least one first fixing portion and the at least one second fixing portion being disposed on a rear side of the bezel body and spaced apart from each other, the at least one first fixing portion being fixed to the back plate in a lateral direction, the at least one second fixing portion being located at a side of the at least one first fixing portion away from the backlight module and fixed to the rear casing in the lateral direction; and
   a panel module fixed on a front side of the bezel body opposite to the rear side of the bezel body and configured to display images.

2. The display device of claim 1, wherein the back plate comprises a back plate back portion and a back plate lateral portion, the back plate lateral portion is connected to the back plate back portion and adjacent to an outer periphery of the back plate back portion, and the back plate lateral portion is fixed to the at least one first fixing portion.

3. The display device of claim 2, wherein at least one engaging hook protrudes from the back plate lateral portion, at least one engaging hole is formed on the at least one first fixing portion, and the back plate lateral portion and the at least one first fixing portion are engaged with each other by engagement of the at least one engaging hook and the at least one engaging hole.

4. The display device of claim 2, wherein at least one engaging hole is formed on the back plate lateral portion, at least one engaging hook protrudes from the at least one first fixing portion, and the back plate lateral portion and the at least one first fixing portion are engaged with each other by engagement of the at least one engaging hole and the at least one engaging hook.

5. The display device of claim 2, wherein the outer bezel frame further comprises at least one rear restraining portion disposed on the rear side of the bezel body, the at least one rear restraining portion is located at a side of the back plate lateral portion away from the at least one first fixing portion, and the back plate lateral portion is restrained between the at least one first fixing portion and the at least one rear restraining portion when the back plate lateral portion is fixed to the at least one first fixing portion.

6. The display device of claim 2, wherein a length of the at least one first fixing portion is less than a length of the back plate lateral portion.

7. The display device of claim 2, wherein the outer bezel frame does not contact with the back plate back portion.

8. The display device of claim 1, wherein the rear casing comprises a rear casing back portion and a rear casing lateral portion, the rear casing lateral portion is connected to the rear casing back portion and adjacent to an outer periphery of the rear casing back portion, and the rear casing lateral portion is fixed to the at least one second fixing portion.

9. The display device of claim 8, wherein at least one engaging hole is formed on the rear casing lateral portion, at least one engaging hook protrudes from the at least one second fixing portion, and the rear casing lateral portion and the second first fixing portion are engaged with each other by engagement of the at least one engaging hole and the at least one engaging hook.

10. The display device of claim 8, wherein at least one engaging hook protrudes from the rear casing lateral portion, at least one engaging hole is formed on the at least one second fixing portion, and the rear casing lateral portion and the at least one second fixing portion are engaged with each other by engagement of the at least one engaging hook and the at least one engaging hole.

11. The display device of claim 8, wherein the at least one first fixing portion is located at a side of the rear casing lateral portion away from the at least one second fixing portion, and the rear casing lateral portion is restrained between the at least one second fixing portion and the at least one first fixing portion when the rear casing lateral portion is fixed to the at least one second fixing portion.

12. The display device of claim 8, wherein the rear casing back portion is fixed to the outer bezel frame in a contacting manner when the rear casing lateral portion is fixed to the at least one second fixing portion.

13. The display device of claim 1, wherein the display device further comprises at least one adhesive component disposed on the front side of the bezel body, and the panel module is attached onto the front side of the bezel body by the at least one adhesive component.

14. The display device of claim 13, wherein the outer bezel frame further comprises at least one front restraining portion disposed on the front side of the bezel body to restrain movement of the at least one adhesive component.

15. The display device of claim 1, wherein the bezel body is a surrounding structure, the outer bezel frame comprises a plurality of first fixing portions disposed on and surrounding the rear side of the bezel body along a surrounding direction, the plurality of first fixing portions are spaced apart from one another, the plurality of first fixing portions are fixed to an outer periphery of the back plate of the backlight module, and the at least one second fixing portion surrounds the rear side of the bezel body and fixed to an outer periphery of the rear casing.

16. The display device of claim 15, wherein the outer bezel frame comprises a plurality of second fixing portions disposed on and surrounding the rear side of the bezel body along the surrounding direction, and the plurality of second fixing portions are spaced apart from one another.

17. The display device of claim 1, wherein the outer bezel frame further comprises a front bezel portion disposed on the front side of the bezel body, and a gap is formed between the front bezel portion and the panel module when the panel module is fixed on the front side of the bezel body.

18. The display device of claim 1, wherein the at least one second fixing portion is restrained between the rear casing and the backlight module when the rear casing and the backlight module are fixed to the at least one second fixing portion and the at least one first fixing portion respectively.

19. The display device of claim 1, wherein the display device further comprises a screw component, a through hole is formed on the rear casing, a screw hole is formed on the outer bezel frame and corresponding to the through hole, and the screw component passes through the through hole to be screwed onto the screw hole, so as to fix the rear casing and the outer bezel frame.

20. An outer bezel frame configured to fix a backlight module and a rear casing of a display device, the outer bezel frame comprising:
   a bezel body;
   at least one first fixing portion disposed on a rear side of the bezel body to fix the backlight module in a lateral direction; and
   at least one second fixing portion disposed on the rear side of the bezel body and spaced apart from the at least one first fixing portion, the at least one second fixing portion being located a side of the at least one first fixing portion away from the backlight module to fix the rear casing in the lateral direction.

21. The outer bezel frame of claim 20, wherein the at least one first fixing portion is located at a side of the rear casing away from the at least one second fixing portion, and the rear casing is restrained between the at least one second fixing portion and the at least one first fixing portion when the rear casing is fixed to the at least one second fixing portion.

22. The outer bezel frame of claim 20, wherein the outer bezel frame further comprises at least one rear restraining portion disposed on the rear side of the bezel body, the at least one rear restraining portion is located at a side of the backlight module away from the at least one first fixing portion, and the backlight module is restrained between the at least one first fixing portion and the at least one rear restraining portion when the backlight module is fixed to the at least one first fixing portion.

23. The outer bezel frame of claim 20, wherein the bezel body is a surrounding structure, the outer bezel frame comprises a plurality of first fixing portions, the plurality of first fixing portions are disposed on and surround the rear side of the bezel body along a surrounding direction to fix an outer periphery of the backlight module, the plurality of first fixing portions are disposed on and surround the rear side of the bezel body are spaced apart from one another, and the at least one second fixing portion surrounds the rear side of the bezel body to fix an outer periphery of the rear casing.

24. The display device of claim 23, wherein the outer bezel frame comprises a plurality of second fixing portions disposed on and surrounding the rear side of the bezel body along the surrounding direction, and the plurality of second fixing portions are spaced apart from one another.

25. The outer bezel frame of claim 20, wherein the at least one second fixing portion is located between the rear casing and the back plate when the rear casing and the back plate are fixed to the at least one second fixing portion and the at least one first fixing portion respectively.

26. A display device comprising:
   a backlight module comprising a back plate and a light emitting assembly disposed on the back plate and configured to emit light beams;
   a rear casing covering the backlight module;
   an outer bezel frame comprising a bezel body, at least one first fixing portion and at least one second fixing portion, the at least one first fixing portion and the at least one second fixing portion being disposed on a rear side of the bezel body and spaced apart from each other, the at least one first fixing portion being fixed to the back plate in a lateral direction, the at least one second fixing portion being fixed to the rear casing in the lateral direction, wherein the at least one first fixing portion and the at least one second fixing portion are connected to each other and alternately configured along a direction surrounding the rear side of the bezel body; and
   a panel module fixed on a front side of the bezel body opposite to the rear side of the bezel body and configured to display images.

* * * * *